United States Patent
Ryan

(10) Patent No.: US 8,357,609 B2
(45) Date of Patent: Jan. 22, 2013

(54) DUAL DAMASCENE-LIKE SUBTRACTIVE METAL ETCH SCHEME

(75) Inventor: Errol T. Ryan, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 344 days.

(21) Appl. No.: 12/773,219

(22) Filed: May 4, 2010

(65) Prior Publication Data

US 2011/0275214 A1 Nov. 10, 2011

(51) Int. Cl.
*H01L 21/4763* (2006.01)
(52) U.S. Cl. ................... 438/627; 257/E21.584
(58) Field of Classification Search .................. 438/409, 438/634, 960
See application file for complete search history.

(56) References Cited

U.S. PATENT DOCUMENTS

| | | | |
|---|---|---|---|
| 6,297,158 B1 * | 10/2001 | Liu et al. | 438/687 |
| 6,737,744 B2 * | 5/2004 | Fukuyama | 257/750 |
| 7,301,107 B2 * | 11/2007 | Karthikeyan et al. | 257/700 |
| 7,358,148 B2 * | 4/2008 | Geffken et al. | 438/421 |

* cited by examiner

*Primary Examiner* — Chandra Chaudhari
(74) *Attorney, Agent, or Firm* — Ditthavong Mori & Steiner, P.C.

(57) ABSTRACT

Metal interconnects are formed with larger grain size and improved uniformity. Embodiments include patterning metal layers into metal interconnects and vias prior to depositing a dielectric layer. An embodiment includes forming metal layers on a substrate, patterning the metal layers to form metal interconnect lines and vias, and forming a dielectric layer on the substrate, metal interconnect lines, and vias, thereby filling gaps between the metal interconnect lines and between the vias. The metal layers may be annealed prior to patterning. A liner may be formed on the sidewalls of the metal interconnect lines and vias prior to forming the dielectric layer. The dielectric layer may be formed of a porous material with a dielectric constant less than 2.4.

20 Claims, 4 Drawing Sheets

DUAL DAMASCENE-LIKE SUBTRACTIVE METAL ETCH SCHEME

TECHNICAL FIELD

The present disclosure relates to methods for forming semiconductor metal interconnects. The present disclosure is particularly applicable to 100 nanometer (nm) pitch devices and smaller.

BACKGROUND

Conventional methods of fabricating back-end-of-line (BEOL) metal interconnect layers employ a copper or copper alloy (Cu) inlay or damascene process, because of difficulties in patterning blanket Cu metal films into interconnect traces. As reductions in device scaling continue, front-end-of-line (FEOL) transistor size becomes smaller, and the number of transistors per unit area increases. Correspondingly, BEOL metal interconnect line pitch decreases. As the metal trench width is reduced, the trench aspect ratio increases, making it increasingly more difficult to deposit barrier/seed layers with good uniformity and integrity, and without creating voids, which cause reliability and yield problems and high line resistance. Grain growth in small features is also limited, which degrades electromigration (EM). In addition, with the dual damascene approach the low-k dielectric in which the trenches are etched becomes damaged by the etch processes, thereby degrading capacitance and time-dependent dielectric breakdown (TDDB).

Reactive ion etching (RIE) or short RIE has also been used for aluminum (Al), as it has the advantage of producing an anisotropic or directional etch pattern. This allows for approximately rectangular interconnect cross sections, which in turn allows for high interconnect densities, as required for modern microchips. However, RIE is difficult to apply to Cu, because Cu does not readily form volatile compounds for a dry etching process, except with high temperatures that are destructive to the semiconductor features. Furthermore, chloride used for dry etching poisons Cu.

Conventional subtractive Al RIE processes also involve a large number of steps. Specifically, blanket Al is patterned to form metal lines, a dielectric layer is formed, vias are etched in the dielectric, and the vias are filled with tungsten (W). In addition, similar to the dual damascene process, the dielectric becomes damaged during the etching of the vias, thereby diminishing the benefits of using a low-k dielectric. Further, W vias have a higher electrical resistance than Al.

A need therefore exists for improved methodology with fewer steps enabling the formation of metal interconnects and vias with improved uniformity and electromigration, without degrading the low-k dielectric, particularly for 100 nm pitch devices and smaller.

SUMMARY

An aspect of the present disclosure is an improved method of fabricating a metal interconnect and via in which the interconnect and via are patterned together prior to forming the dielectric layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating metal interconnects, the method comprising: forming metal layers on a substrate; patterning the metal layers to form metal interconnect lines and vias; and forming a dielectric layer on the substrate, metal interconnect lines, and vias, thereby filling gaps between the metal interconnect lines and between the vias.

Aspects of the present disclosure include patterning the metal layers by subtractive etching. Further aspects include annealing the metal layers prior to patterning. Other aspects include forming the metal layers of copper (Cu). Another aspect includes forming the metal layers of aluminum (Al). Additional aspects include forming a barrier layer on each metal layer. Further aspects include forming a liner on sidewalls of the metal interconnect lines and the vias prior to depositing the dielectric layer. Other aspects include forming the liner by electroplating, selective atomic layer deposition, selective chemical vapor deposition, or deposition followed by spacer etching. Another aspect includes chemical mechanical polishing the dielectric layer. Additional aspects include forming additional layers of interconnect lines by repeating the steps of forming metal layers, patterning the metal layers to form metal interconnect lines and vias, and forming a dielectric layer.

Another aspect of the present disclosure is a method of fabricating metal interconnects, the method comprising: forming a first metal layer on a substrate; forming a second metal layer on the first metal layer; etching the first and second metal layers to form metal interconnect lines and vias on the metal interconnects; and depositing a dielectric layer on the substrate, metal interconnect lines, and vias, thereby filling gaps between the metal interconnect lines and between the vias.

Aspects include annealing the first and second metal layers prior to etching. Further aspects include depositing a barrier layer on each metal layer. Other aspects include forming the first and second metal layers of copper (Cu). Another aspect includes forming a liner on sidewalls of the metal interconnect lines and the vias prior to depositing the dielectric layer. Additional aspects include forming the liner by electroplating, selective atomic layer deposition, chemical vapor deposition, or deposition followed by spacer etching. Further aspects include forming the first and second metal layers of aluminum (Al). Other aspects include etching the first and second metal layers by subtractive etching. Additional aspects include depositing a porous dielectric material with a dielectric constant less than 2.4 to form the dielectric layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 12A and FIGS. 1B through 12B schematically illustrate cross sectional and top down views, respectively, of sequential steps of a method in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the metal fill problems attendant upon forming Cu interconnects by a dual damascene process, reduces the number of steps of an Al subtractive RIE process, and solves problematic low-k dielectric damage attendant upon forming interconnects by either process. In accordance with embodiments of the present disclosure, metal such as Al or Cu is blanket deposited on the substrate and etched into interconnects and vias prior to forming the dielectric layer. Consequently, no metal fill is required, the number of steps is reduced by patterning both the interconnect lines and vias together, and the dielectric is not exposed to plasma, and, therefore is not damaged. Accordingly, capacitance is improved.

Methodology in accordance with embodiments of the present disclosure includes forming metal layers on a substrate, patterning the metal layers to form metal interconnect lines and vias, and forming a dielectric layer on the substrate, metal interconnect lines, and vias, thereby filling gaps between the metal interconnect lines and between the vias.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
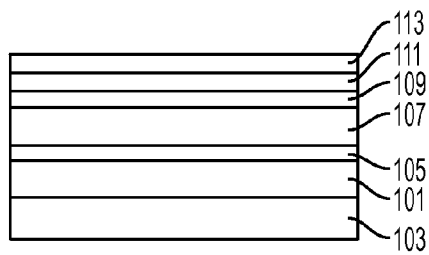
Figure 1B:

Adverting to FIGS. 1A and 1B, a first layer of metal 101 is formed on a substrate 103. A barrier layer 105 optionally may be formed on first metal layer 101. A second metal layer 107 and optional second barrier layer 109 are consecutively formed on barrier layer 105. Metal layers 101 and 107 may be formed of Cu, Al, W or any other conductive material suitable for metal lines. Barrier layers 105 and 109 may be formed, for example, of tantalum (Ta). Metal layers 101 and 107 are then annealed, thereby maximizing grain size. A mask layer 111 may be formed on barrier layer 109, for example of silicon nitride (SiN), silicon carbon nitride (SiCN), silicon carbide (SiC), an organic material, or other suitable mask material. An oxide layer 113 may be formed on mask layer 111.

Figure 2A:
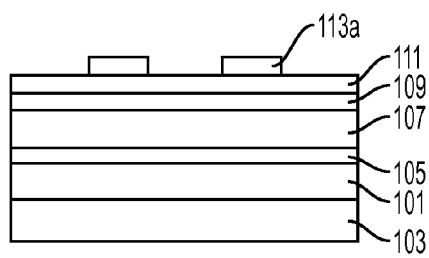
Figure 2B:
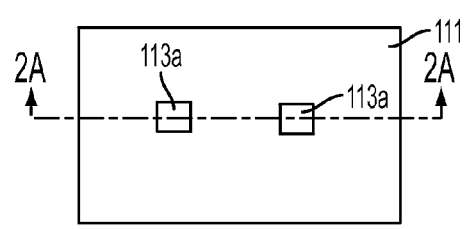

A photoresist (not shown for illustrative convenience) is formed and patterned on oxide layer 113. Oxide layer 113 is lithographically patterned through the photoresist to form islands 113a of oxide where vias will later be formed, and the photoresist is removed, as illustrated in FIGS. 2A and 2B.

Figure 3A:
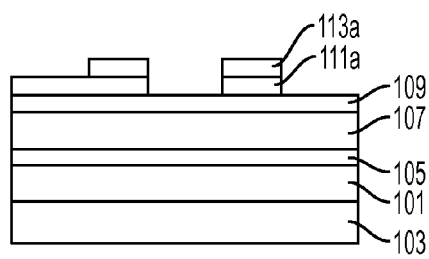
Figure 3B:
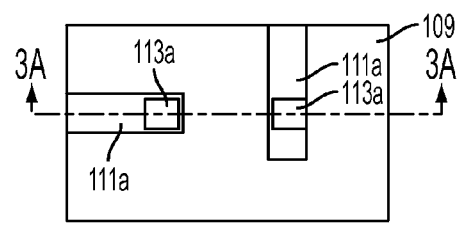

Adverting to FIGS. 3A and 3B, another photoresist (not shown for illustrative convenience) is formed and patterned on oxide islands 113a and mask layer 111. Mask layer 111 is then lithographically patterned through the photoresist, removing mask material except where metal lines will later be formed, thereby forming patterned mask 111a, and the photoresist is removed.

Figure 4A:
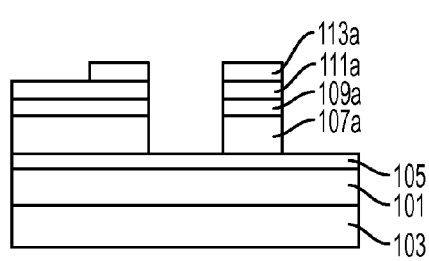
Figure 4B:
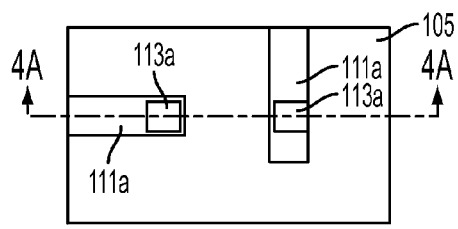

Using patterned mask 111a, a subtractive etch is employed to remove metal layer 107 and barrier layer 109 except where metal lines are to be formed, resulting in the structure shown in FIGS. 4A and 4B. As illustrated, patterned metal layer 107a and patterned barrier layer 109a remain, covered with patterned mask 111a. Etchants used for patterning metal layer 107 may include chlorine (Cl) based etchants, such as $Cl_2$, boron trichloride ($BCl_3$), trichloromethane or chloroform ($CHCl_3$), carbon tetrachloride ($CCl_4$) for Al and other non-Cu metals. For etching Cu, other etchants may be employed.

Figure 5A:
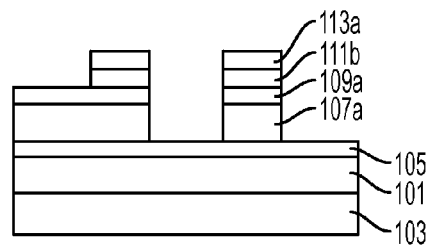
Figure 5B:
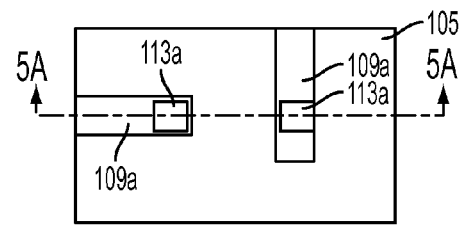

As illustrated in FIGS. 5A and 5B, patterned mask 111a is etched leaving mask islands 111b, covered with oxide islands 113a, where vias will be formed.

Figure 6A:
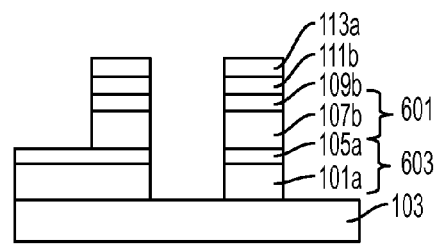
Figure 6B:
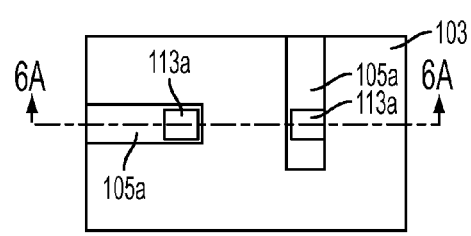

Adverting to FIGS. 6A and 6B, patterned metal layer 107a and patterned barrier layer 109a are etched to form metal layer islands 107b and barrier layer islands 109b, respectively, which together form vias 601, while metal layer 101 and barrier layer 105 are etched to form patterned metal layer 101a and patterned barrier layer 105a, respectively, which together form metal interconnect lines 603. All metal is removed except for vias 601 and metal interconnect lines 603. The etchant may be the same as that used for etching metal layer 107 and barrier layer 109 in FIGS. 4A and 4B. Etchants used for etching metal layers 101 and 107 may be selective to barrier metals 105 and 109, and different etchants may be used for barrier layers 105 and 109. In addition, etching parameters, such as temperature and time, may be controlled to stop etching on barrier layer 105.

Figure 7A:
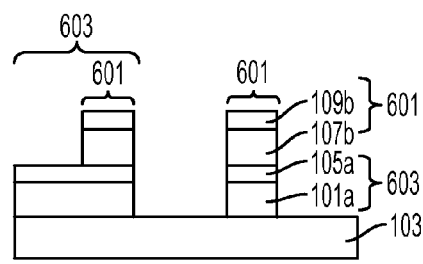
Figure 7B:
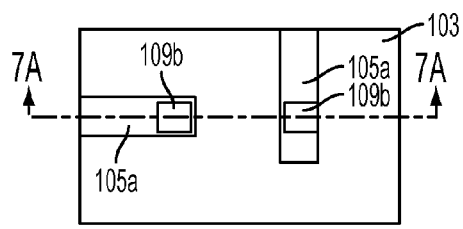

After metal interconnect lines 603 and vias 601 are formed, oxide islands 113a and mask islands 111b are removed, such as by etching. Barrier layer islands 109b are thereby exposed, as illustrated in FIGS. 7A and 7B.

Figure 8A:
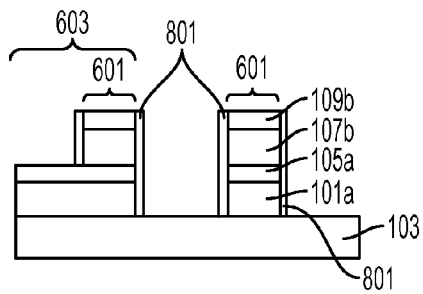
Figure 8B:
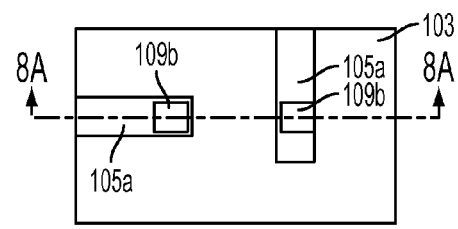

Adverting to FIGS. 8A and 8B, a liner 801, for example Ta, tantalum nitride (TaN), cobalt (Co), W, ruthinium (Ru), titanium (Ti), or titanium nitride (TiN), may then be formed on sidewalls of vias 601 and metal interconnect lines 603 to prevent metal, especially Cu, from diffusing into the dielectric that will later fill the gaps. Liner 801 may be formed by deposition and spacer etch, electroplating, or selective atomic layer deposition (ALD) or chemical vapor deposition (CVD). A wet or dry cleaning step may be performed on the substrate between metal interconnect lines 603.

Figure 9A:
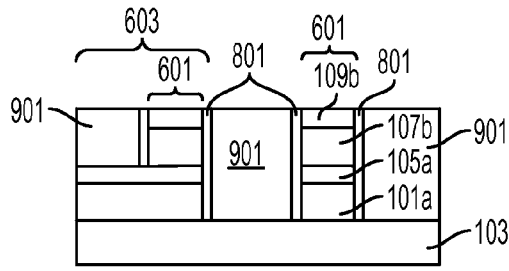
Figure 9B:
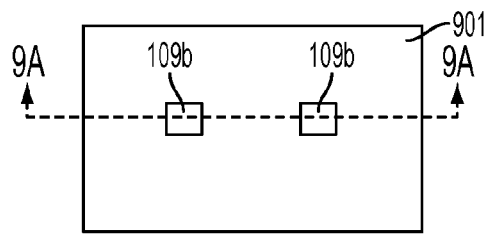

As illustrated in FIGS. 9A and 9B, a dielectric is then deposited to fill the gaps between metal interconnect lines 603 and between vias 601, followed by chemical mechanical polishing (CMP), to prepare the surface for the next layer of metal interconnect lines.

Figure 10A:
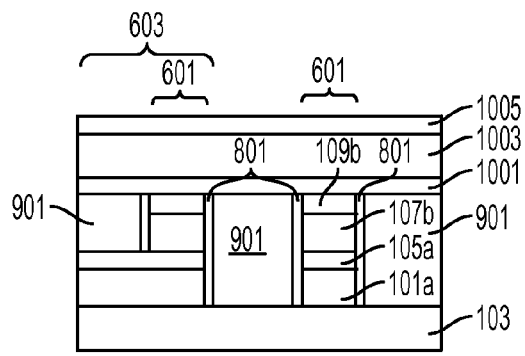
Figure 10B:
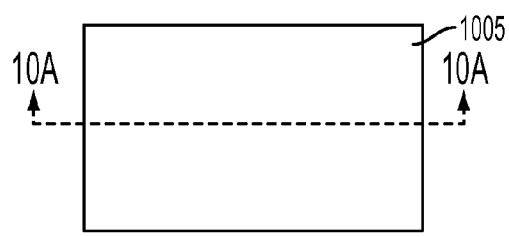
Figure 11A:
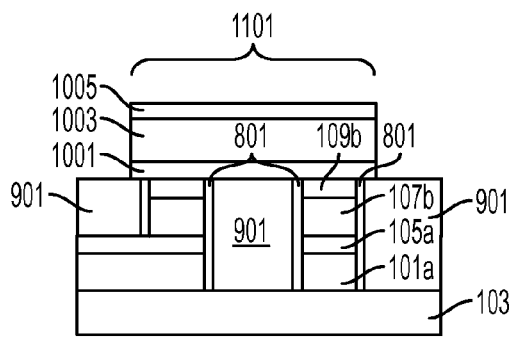
Figure 11B:
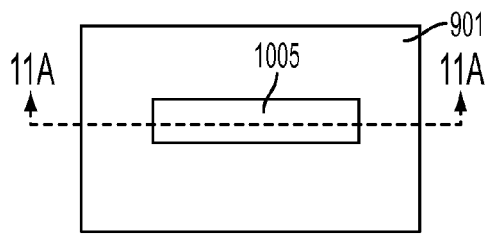

A third barrier layer 1001, third metal layer 1003, and fourth barrier layer 1005 may then be deposited, as illustrated in FIGS. 10A and 10B. Layers 1001, 1003, and 1005 may be patterned and etched to form a second layer of metal interconnect lines 1101, as illustrated in FIGS. 11A and 11B. The same etchants employed for etching first vias 601 and first metal interconnect lines 603 may be used for etching second metal interconnect lines 701. Prior to patterning, third metal layer 1003 may be annealed to maximize grain size.

Figure 12A:
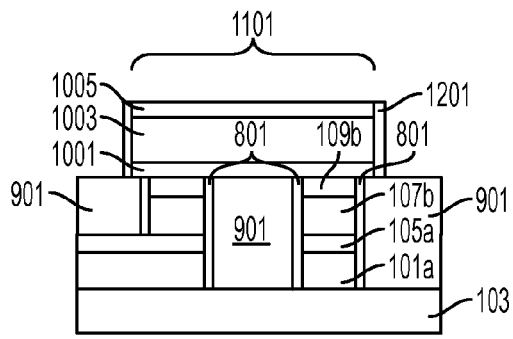
Figure 12B:
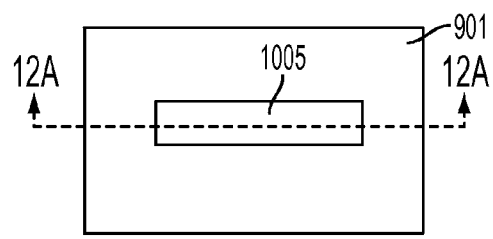

Adverting to FIGS. 12A and 12B, liner 1201 may be deposited on sidewalls of second metal interconnect lines, for example of the same materials and by the same methods as used for liner 801. Although the formation of two layers of metal interconnect lines are described, additional layers may be formed by repeating the line and via patterning illustrated in FIGS. 1 through 9 prior to forming third barrier layer 1001, third metal layer 1003, and fourth barrier layer 1005.

Figure 13:
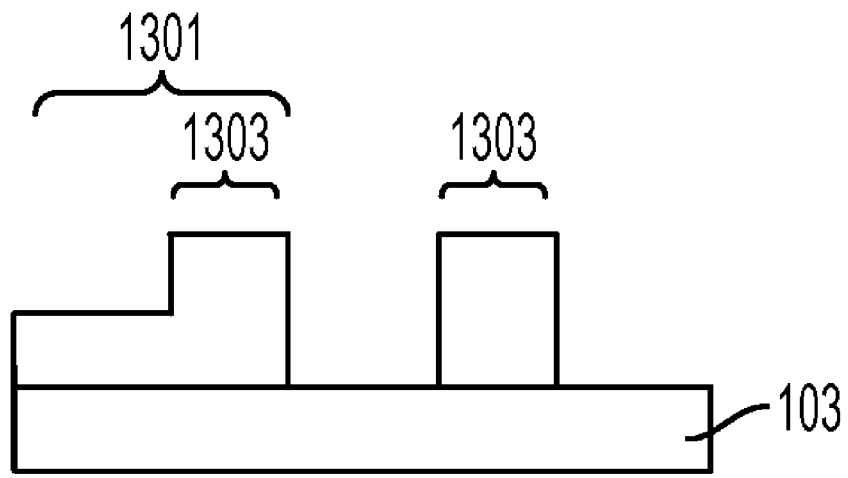
FIGS. 13 and 14 schematically illustrate steps corresponding to FIGS. 7 and 8 when no barrier and/or etch-stop layers are employed.
Figure 14:
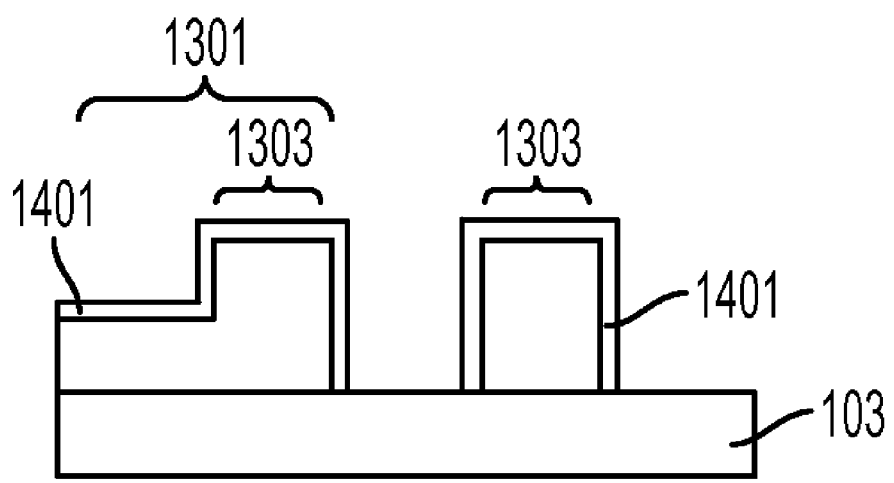

In the case where no barrier layers or etch stop layers are employed, etching parameters, such as temperature and time, may be regulated to control the etching shown in FIGS. 4 and 6. Then, after the oxide islands and masking layer islands are removed, as described with respect to FIG. 7, only metal interconnect lines 1301 and vias 1303 remain, as illustrated in FIG. 13. Metal, for example cobalt tungsten phosphide (CoWP), CVD Ru, or CVD W, is then selectively deposited only on the metal and not on other surfaces, to form liner 1401, as illustrated in FIG. 14. The process then continues as described with respect to FIGS. 9 through 12.

The embodiments of the present disclosure achieve several technical effects, including improved interconnect resistance and yield, electromigration, capacitance, and TDDB, with about the same number of process steps as conventional dual damascene approaches. The present disclosure enjoys industrial applicability in any of various types of highly integrated semiconductor devices particularly 100 nm pitch devices and smaller.

In the preceding description, the present disclosure is described with reference to specifically exemplary embodiments thereof It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method of fabricating metal interconnects, the method comprising:
    forming metal layers on a substrate;
    patterning the metal layers to form metal interconnect lines and vias; and
    forming a dielectric layer on the substrate, on and between the formed metal interconnect lines, and on and between the formed vias, thereby filling all gaps between the formed metal interconnect lines and between the formed vias.

2. The method according to claim 1, comprising patterning the metal layers by subtractive etching.

3. The method according to claim 1, comprising annealing the metal layers prior to patterning.

4. The method according to claim 1, comprising forming the metal layers of copper (Cu).

5. The method according to claim 1, comprising forming the metal layers of aluminum (Al).

6. The method according to claim 1, further comprising forming a barrier layer on each metal layer.

7. The method according to claim 1, further comprising forming a liner on sidewalls of the formed metal interconnect lines and the formed vias prior to depositing the dielectric layer.

8. The method according to claim 7, comprising forming the liner by electroplating, selective atomic layer deposition, chemical vapor deposition, or deposition followed by spacer etching.

9. The method according to claim 1, further comprising chemical mechanical polishing the dielectric layer.

10. The method according to claim 9, further comprising forming additional layers of interconnect lines by repeating the steps of forming metal layers, patterning the metal layers to form metal interconnect lines and vias, and forming a dielectric layer.

11. A method of fabricating metal interconnects, the method comprising:
    forming a first metal layer on a substrate;
    forming a second metal layer on the first metal layer;
    etching the first and second metal layers to form metal interconnect lines on the substrate and vias on the metal interconnect lines; and
    depositing a dielectric layer on the substrate, on and between the formed metal interconnect lines, and on and between the formed vias, thereby filling all gaps between the formed metal interconnect lines and between the formed vias.

12. The method according to claim 11, further comprising annealing the first and second metal layers prior to etching.

13. The method according to claim 11, further comprising depositing a barrier layer on each metal layer.

14. The method according to claim 11, comprising forming the first and second metal layers of copper (Cu).

15. The method according to claim 14, further comprising forming a liner on sidewalls of the formed metal interconnect lines and of the formed vias prior to depositing the dielectric layer.

16. The method according to claim 15, comprising forming the liner by electroplating, selective atomic layer deposition, chemical vapor deposition, or deposition followed by spacer etching.

17. The method according to claim 11, comprising forming the first and second metal layers of aluminum (Al).

18. The method according to claim 11, comprising etching the first and second metal layers by subtractive etching.

19. The method according to claim 11, comprising depositing a porous dielectric material with a dielectric constant less than 2.4 to form the dielectric layer.

20. A method of fabricating multiple layers of metal interconnects, the method comprising:
    blanket depositing first and second copper (Cu) layers on a substrate, with a first tantalum (Ta) barrier layer therebetween;
    annealing the first and second Cu layers;
    subtractive etching the first and second Cu layers to form a first layer of metal interconnect lines and first vias on the first metal interconnect lines;
    forming first liners on sidewalls of the first metal interconnect lines and first vias;
    depositing a first porous dielectric layer, with a dielectric constant less than 2.4, on the substrate, first metal interconnect lines, and first vias, thereby filling gaps between the metal interconnect lines and between the vias;
    chemical mechanical polishing the dielectric layer;
    blanket depositing third and fourth Cu layers on the dielectric layer with a second Ta barrier layer therebetween;
    annealing the third and fourth Cu layers;
    subtractive etching the third and fourth Cu layers to form a second layer of metal interconnect lines and second vias on the second metal interconnect lines;
    forming second liners on sidewalls of the second metal interconnect lines and second vias; and
    depositing a second porous dielectric layer, with a dielectric constant less than 2.4, on the first dielectric layer, second metal interconnect lines, and second vias, thereby filling gaps between the metal interconnect lines and between the vias.

* * * * *